US009607851B2

(12) United States Patent
Rui et al.

(10) Patent No.: US 9,607,851 B2
(45) Date of Patent: Mar. 28, 2017

(54) METHOD FOR REMOVING POLYSILICON PROTECTION LAYER ON A BACK FACE OF AN IGBT HAVING A FIELD STOP STRUCTURE

(71) Applicant: CSMC TECHNOLOGIES FAB1 CO., LTD., Jiangsu (CN)

(72) Inventors: Qiang Rui, Jiangsu (CN); Shuo Zhang, Jiangsu (CN); Genyi Wang, Jiangsu (CN); Xiaoshe Deng, Jiangsu (CN)

(73) Assignee: CMSC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 14/411,978

(22) PCT Filed: Jul. 25, 2013

(86) PCT No.: PCT/CN2013/080150
§ 371 (c)(1),
(2) Date: Dec. 30, 2014

(87) PCT Pub. No.: WO2014/015821
PCT Pub. Date: Jan. 30, 2014

(65) Prior Publication Data
US 2015/0155182 A1 Jun. 4, 2015

(30) Foreign Application Priority Data
Jul. 26, 2012 (CN) .......................... 2012 1 0260773

(51) Int. Cl.
*H01L 21/311* (2006.01)
*H01L 21/3213* (2006.01)
(Continued)

(52) U.S. Cl.
CPC .. *H01L 21/31116* (2013.01); *H01L 21/32137* (2013.01); *H01L 29/66325* (2013.01); *H01L 29/66333* (2013.01); *H01L 21/32105* (2013.01)

(58) Field of Classification Search
CPC ......... H01L 21/31116; H01L 29/66325; H01L 29/66333; H01L 21/32137; H01L 21/32105
See application file for complete search history.

(56) References Cited

U.S. PATENT DOCUMENTS 6,309,929 B1 * 10/2001 Hsu .................... H01L 29/0661 257/496
2003/0107041 A1 * 6/2003 Tanimoto .......... H01L 29/66068 257/77

FOREIGN PATENT DOCUMENTS

CN 101752415 A 6/2010
CN 101759140 A 6/2010

OTHER PUBLICATIONS

International Search Report for PCT/CN2013/080150, ISA/CN, Beijing, mailed Oct. 31, 2013.
(Continued)

*Primary Examiner* — John P Dulka
*Assistant Examiner* — Charles R Peters
(74) *Attorney, Agent, or Firm* — Stephen T. Olson; Harness, Dickey & Pierce, P.L.C.

(57) ABSTRACT

Disclosed is a method for removing a polysilicon protection layer (12) on a back face of an IGBT having a field stop structure (10). The method comprises thermally oxidizing the polysilicon protection layer (12) on the back face of the IGBT until the oxidation is terminated on a gate oxide layer (11) located above the polysilicon protection layer (12) to form a silicon dioxide layer (13), and removing the formed silicon dioxide layer (13) and the gate oxide layer (11) by a
(Continued)

dry etching process. The method for removing the protection layer is easier to control.

20 Claims, 5 Drawing Sheets

(51) Int. Cl.
*H01L 29/66* (2006.01)
*H01L 21/321* (2006.01)

(56) References Cited

OTHER PUBLICATIONS

First Office Action regarding Chinese Application No. 201210260773.4, dated Sep. 6, 2015. English translation provided by P.C. & Associates.

* cited by examiner

METHOD FOR REMOVING POLYSILICON PROTECTION LAYER ON A BACK FACE OF AN IGBT HAVING A FIELD STOP STRUCTURE

CROSS-REFERENCE TO RELATED APPLICATIONS

This application is a 371 U.S. National Stage of International Application No. PCT/CN2013/080150, filed on Jul. 25, 2013, which claims priority to Chinese Patent Application No. 201210260773.4, filed on Jul. 26, 2012. The disclosures of the above applications are incorporated herein by reference.

FIELD OF INVENTION

The present invention relates to semiconductor technology, and in particular to a process for removing a polysilicon protection layer on a back face of an IGBT structure having a field stop structure.

BACKGROUND

IGBT (Insulated Gate Bipolar Transistor) is a compound full-controlled voltage-driven power semiconductor device composed of a bipolar transistor and an insulated gate field effect transistor, and it has the advantages of both high input impedance characteristic of MOSFET and low forward voltage drop characteristic of GTR, and is characterized by low drive power and low saturation voltage drop. Therefore, IGBT is quite applicable to converter systems with a direct voltage of 600V or above, such as alternating current dynamos, variable-frequency drives, switch-mode power supplies, lighting circuits, traction drives and other areas.

In a manufacturing process of an IGBT, a silicon dioxide ($SiO_2$) layer and a polysilicon protection layer on the back face of the IGBT having an FS (Field Stop) structure are removed by means of wet etching of silicon on the back face (SEZ) in the backend process of the entire manufacturing process. As this conventional removing method is implemented in the backend process where a front face metal layer has already been formed, there is a risk of metal contamination. In addition, since SEZ can etch silicon, it may be easy to corrode the formed field stop layer due to inadequate control when removing the $SiO_2$ layer.

SUMMARY OF THE INVENTION

In view of the foregoing, the present invention provides a method for removing a polysilicon protection layer on a back face of an IGBT having a field sop structure. The method comprises thermally oxidizing the polysilicon protection layer on the back face of the IGBT until the oxidation is terminated on a gate oxide layer located above the polysilicon protection layer to form a $SiO_2$ layer, and removing the formed $SiO_2$ layer and the gate oxide layer by a dry etching process.

The present invention further provides a method for removing a polysilicon protection layer on a back face of an IGBT having a field stop structure, wherein the method comprises the following steps: a) thermally oxidizing a portion of the polysilicon protection layer to form a $SiO_2$ layer; b) removing the formed $SiO_2$ layer by a dry etching process; c) repeating the steps a) and b), until the thermal oxidation process in step a) is terminated on a gate oxide layer located above the polysilicon protection layer; and removing the last formed $SiO_2$ layer and the gate oxide layer by a dry etching process.

The present invention further provides a method for forming an IGBT structure, which comprises removing a polysilicon protection layer and a gate oxide layer by the above mentioned methods, implanting ions into a face where the polysilicon protection layer and the gate oxide layer have been removed so as to form a P+ layer, and depositing a metal formed layer on the formed P+ layer.

According to the method of the present invention, the removal of the polysilicon protection layer avoids the risk of metal contamination.

DETAILED DESCRIPTION

Now a further description of the present invention will be made in combination with the accompanying drawings. Those skilled in the art would appreciate that, the following discussion is merely non-limiting explanation of the subject of the present invention in combination with specific implementations, the scope claimed by the present invention shall be defined by the appended claims and any modification or change without departing from the spirit of the present invention shall fall within the scope defined by the claims of the present invention.

In the descriptions hereinafter, the same layers will be indicated by the same reference numbers in the accompanying drawings.

Example 1

Figure 1:
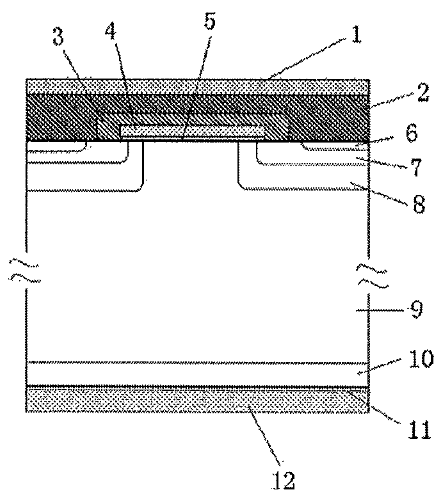
FIG. 1 illustrates an IGBT structure having a back face protection layer.
Figure 2:
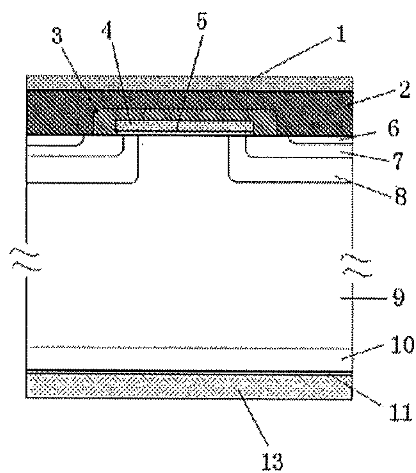
FIG. 2 illustrates an IGBT structure wherein a polysilicon protection layer 12 has been oxidized to form a $SiO_2$ layer 13.
Figure 3:
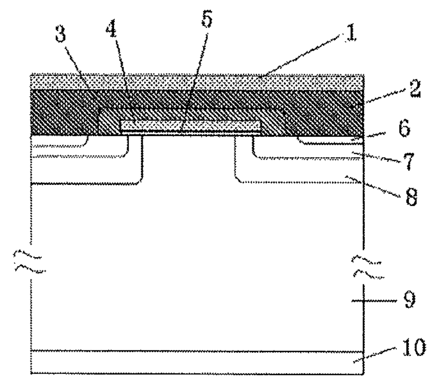
FIG. 3 illustrates an IGBT structure wherein the $SiO_2$ layer 13 and a gate oxide layer 11 have been etched off.
Figure 4:
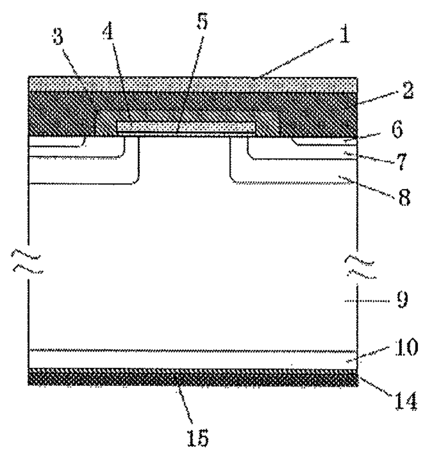
FIG. 4 illustrates an IGBT structure including a P+ layer 14 and a metal layer 15.

FIG. 1 illustrates an IGBT structure having a back face protection layer. As shown in FIG. 1, the IGBT structure comprises a surface passivation layer 1, a metal layer 2, a dielectric layer 3, a polysilicon layer 4, a gate oxide layer 5, a P+ layer 6, an N+ layer 7, a P-body layer 8, a drift region 9; a field stop layer 10, a gate oxide layer 11; and a polysilicon protection layer 12. According to this embodiment, the polysilicon protection layer 12 is thermally oxidized to become $SiO_2$ completely, wherein the thermal oxidation is a conventional thermal oxidation method, for example, atmospheric pressure oxidation or high pressure oxidation. Due to a barrier effect of the gate oxide layer 11 (which is an oxide dielectric layer formed by $SiO_2$), oxidation of the polysilicon protection layer 12 may be terminated because of contact with the gate oxide layer 11 after polysilicon has been oxidized completely. FIG. 2 illustrates an IGBT structure wherein the polysilicon protection layer 12 has been oxidized to form a $SiO_2$ layer 13. According to this embodiment of the present invention, after the polysilicon protection layer 12 has been oxidized to become the $SiO_2$ layer 13, the $SiO_2$ layer 13 thus formed and the gate oxide layer 11 already formed in FIG. 1 are removed by a dry etching process, wherein dry etching may be plasma etching, ion beam burnishing or reactive ion etching (RIE). FIG. 3 illustrates an IGBT structure wherein the $SiO_2$ layer 13 and the gate oxide layer 11 have been etched off. Afterwards, a P+ layer is formed by ion implantation on the back face, and then, metal deposition is performed on the back face by a method of, for example, evaporation deposition, hence the whole device structure is formed, wherein the ions forming the P+ layer are trivalent ions, such as boron. FIG. 4 illustrates an IGBT structure including a P+ layer 14 and a metal layer 15.

According to the method described above, the polysilicon protection layer is oxidized to form the $SiO_2$ layer by means of thermal oxidation, which, as compared to the conventional SEZ method, prevents the problem of corroding the field stop layer 10. In addition, as the oxidation of the polysilicon protection layer 12 and the removal of the $SiO_2$ layer 13 and the gate oxide layer 11 occur before formation of the metal layer, the risk of metal contamination is also avoided.

Example 2

Figure 5:
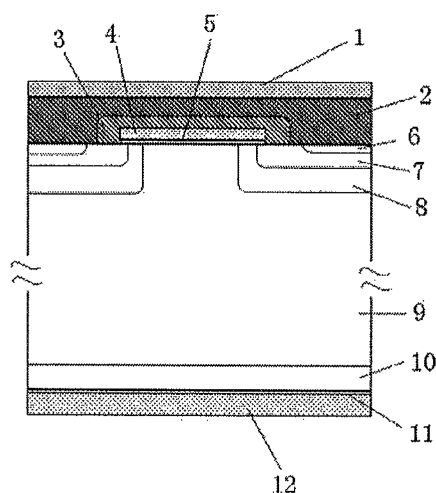
FIG. 5 illustrates an IGBT structure having a back face protection layer.
Figure 6:
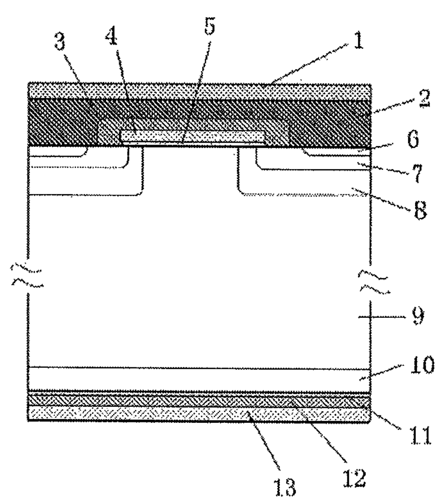
FIG. 6 illustrates an IGBT structure wherein a portion of the polysilicon protection layer 12 in the IGBT structure as shown in FIG. 5 has been oxidized to form a $SiO_2$ layer 13.
Figure 7:
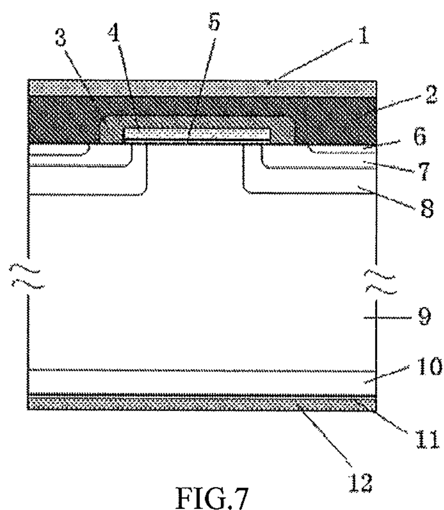
FIG. 7 illustrates an IGBT structure wherein the $SiO_2$ layer 13 as shown in FIG. 6 has been removed.
Figure 8:
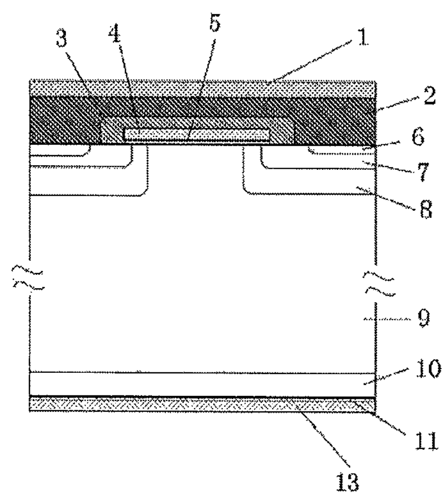
FIG. 8 illustrates an IGBT structure wherein the last polysilicon protection layer 12 left after multiple times of thermal oxidation in the structure as shown in FIG. has been thermally oxidized to form a last $SiO_2$ layer 13.
Figure 9:
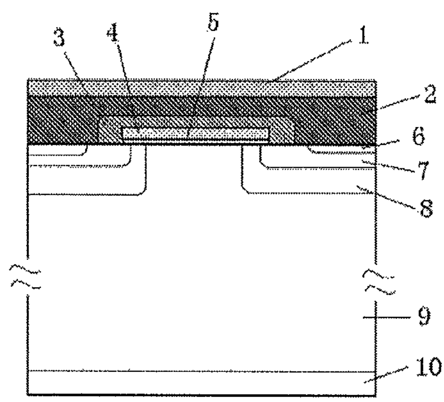
FIG. 9 illustrates an IGBT structure wherein the gate oxide layer 11 and the polysilicon protection layer 12 in the structure as shown in FIG. 5 have been removed.
Figure 10:
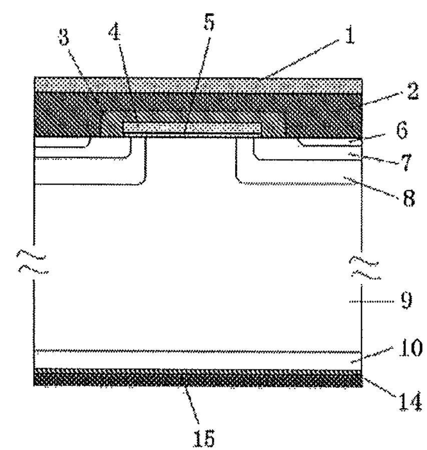
FIG. 10 illustrates an IGBT structure wherein a P+ layer 14 and a metal layer 15 have been formed in the IGBT structure as shown in FIG. 9.

As in FIG. 1, FIG. 5 illustrates an IGBT structure having a back face protection layer. As shown in the figure, the IGBT structure comprises a surface passivation layer 1, a metal layer 2, a dielectric layer 3, a polysilicon layer 4, a gate oxide layer 5, a P+ layer 6, an N+ layer 7, a Pbody layer 8, a drift region 9; a field stop layer 10, a gate oxide layer 11; and a polysilicon protection layer 12. According to this embodiment, a portion of the polysilicon protection layer 12 is thermally oxidized to $SiO_2$, wherein thermal oxidation is a conventional thermal oxidation method, for example, atmospheric pressure oxidation or high pressure oxidation. FIG. 6 illustrates an IGBT structure wherein a portion of the polysilicon protection layer 12 has been thermally oxidized to form a $SiO_2$ layer 13. Afterwards, the $SiO_2$ layer 13 is etched off by a dry etching process, wherein dry etching may be plasma etching, ion beam burnishing or reactive ion etching (RIE). FIG. 7 illustrates an IGBT structure wherein the $SiO_2$ layer 13 has been removed. As compared to that of the IGBT structure shown in FIG. 5, the polysilicon protection layer 12 of the IGBT structure shown in FIG. 7 has become thinner. A further portion of the polysilicon protection layer 12 in the structure shown in FIG. 7 is oxidized to become the $SiO_2$ layer 13, and then the $SiO_2$ layer is removed by means of dry etching. This process is repeated until the last remaining polysilicon protection layer 12 is thermally oxidized finally. Due to a barrier effect of the gate oxide layer 11 (which is an oxidate dielectric layer formed by $SiO_2$), oxidation of the remaining polysilicon protection layer 12 may be terminated because of contact with the gate oxide layer 11 after polysilicon has been oxidized completely. FIG. 8 illustrates an IGBT structure wherein the last polysilicon protection layer 12 has been thermally oxidized to form a last $SiO_2$ layer 13. The last $SiO_2$ layer 13 and the gate oxide layer 11 are removed by means of dry etching to form a IGBT structure as shown in FIG. 9, which, when compared with the structure shown in FIG. 5, does not include the gate oxide layer 11 and the polysilicon protection layer 12. Afterwards, a P+ layer is formed by ion implantation on the back face, and then, metal deposition is performed on the back face by a method of, for example, evaporation deposition, hence the whole device structure is formed, wherein the ions forming the P+ layer are trivalent ions, such as boron. FIG. 10 illustrates an IGBT structure including a P+ layer 14 and a metal layer 15.

Similar to Example 1, as compared to the conventional SEZ method, the method in this example employs a thermal oxidation process to oxidize the polysilicon protection layer to form a $SiO_2$ layer, thus preventing the problem of corroding the field stop layer 10. In addition, as the oxidation of the polysilicon protection layer 12 and the removal of the $SiO_2$ layer 13 and the gate oxide layer 11 occur before formation of the metal layer, the risk of metal contamination is also avoided.

The method in Example 2 employs multiple times of oxidation as well as multiple times of dry etching, and therefore, is more applicable to a structure with a thicker polysilicon protection layer.

In a word, the present invention employs a method of thermal oxidation to transform the polysilicon on the back face gradually into $SiO_2$, and, due to a barrier effect of $SiO_2$, oxidation of the polysilicon protection layer is terminated on the back face oxide layer. Afterwards, the back face $SiO_2$ is removed by a dry etching process, which may not only be compatible with the conventional IGBT process and save costs, but also guarantee that the back face FS layer will be not etched, so as to ensure sufficient thickness of the FS layer, hence it is well guaranteed that the performance parameters of device will not be affected. The back face described above refers to a face on which the metal layer 15 is formed. The back face $SiO_2$ refers to the $SiO_2$ layer 13 described above.

What is claimed is:

1. A method for removing a polysilicon protection layer on a back face of an IGBT having a field stop structure, comprising:

thermally oxidizing the polysilicon protection layer on the back face of the IGBT until the oxidation is terminated on a gate oxide layer located above the polysilicon protection layer to form a $SiO_2$ layer; and removing the formed $SiO_2$ layer and the gate oxide layer by a dry etching process.

2. The method of claim 1, wherein the gate oxide layer is removed after the oxidation is terminated.

3. The method of claim 1, wherein oxidation of the polysilicon protection layer is terminated after complete oxidation of the polysilicon protection layer.

4. The method of claim 3, wherein oxidation of the polysilicon protection layer is terminated due to contact with the gate oxide layer.

5. The method of claim 1, wherein thermally oxidizing the polysilicon protection layer includes gradually transforming the polysilicon protection layer on the back face of the IGBT into $SiO_2$.

6. The method of claim 1, wherein termination of oxidation of the polysilicon protection layer is due to a barrier effect of $SiO_2$.

7. The method of claim 1, wherein thermal oxidation of the polysilicon protection layer is terminated due to contact with the gate oxide layer after polysilicon has been completely oxidized.

8. The method of claim 1, wherein the gate oxide layer is a dielectric layer formed by $SiO_2$, and further wherein method further comprises creating a barrier effect with the gate oxide layer to terminate oxidation.

9. The method of claim 1, wherein the step of thermally oxidizing includes:

gradually transforming polysilicon on the back face into $SiO_2$; and terminating oxidation of the polysilicon protection layer due to a barrier effect of the $SiO_2$.

10. A method for removing a polysilicon protection layer on a back face of an IGBT having a field stop structure, comprising the following steps:

a) thermally oxidizing a portion of the polysilicon protection layer to form a $SiO_2$ layer;

b) removing the formed $SiO_2$ layer by a dry etching process;

c) repeating the steps a) and b), until the thermal oxidation process in step a) is terminated on a gate oxide layer located above the polysilicon protection layer; and removing the last formed $SiO_2$ layer and the gate oxide layer by a dry etching process.

11. The method of claim 10, wherein the gate oxide layer is removed after the oxidation is terminated.

12. The method of claim 10, wherein oxidation of the polysilicon protection layer is terminated after complete oxidation of the polysilicon protection layer.

13. The method of claim 12, wherein oxidation of the polysilicon protection layer is terminated due to contact with the gate oxide layer.

14. The method of claim 10, wherein thermally oxidizing the polysilicon protection layer includes gradually transforming the polysilicon protection layer on the back face of the IGBT into $SiO_2$.

15. The method of claim 10 wherein termination of oxidation of the polysilicon protection layer is due to a barrier effect of $SiO_2$.

16. The method of claim 10, wherein thermal oxidation of the polysilicon protection layer is terminated due to contact with the gate oxide layer after polysilicon has been completely oxidized.

17. The method of claim 10, wherein the gate oxide layer is a dielectric layer formed by $SiO_2$, and further wherein method further comprises creating a barrier effect with the gate oxide layer to terminate oxidation.

18. The method of claim 10, wherein the step of thermally oxidizing includes:

gradually transforming polysilicon on the back face into $SiO_2$; and terminating oxidation of the polysilicon protection layer due to a barrier effect of the $SiO_2$.

19. A method comprising:

removing a polysilicon protection layer on a back face of an IGBT having a field stop structure by:

thermally oxidizing the polysilicon protection layer on the back face of the IGBT until the oxidation is terminated on a gate oxide layer located above the polysilicon protection layer to form a $SiO_2$ layer; and removing the formed $SiO_2$ layer and the gate oxide layer by a dry etching process; and forming an IGBT structure by:

implanting ions into a face where the polysilicon protection layer and the gate oxide layer have been removed so as to form a P+ layer; and depositing a metal formed layer on the formed P+ layer.

20. A method comprising:

removing a polysilicon protection layer on a back face of an IGBT having a field stop structure by:

a) thermally oxidizing a portion of the polysilicon protection layer to form a $SiO_2$ layer;

b) removing the formed $SiO_2$ layer by a dry etching process;

c) repeating the steps a) and b), until the thermal oxidation process in step a) is terminated on a gate oxide layer located above the polysilicon protection layer; and d) removing the last formed $SiO_2$ layer and the gate oxide layer by a dry etching process; and forming an IGBT structure by:

implanting ions into a face where the polysilicon protection layer and the gate oxide layer have been removed so as to form a P+ layer; and depositing a metal formed layer on the formed P+ layer.

* * * * *

UNITED STATES PATENT AND TRADEMARK OFFICE

CERTIFICATE OF CORRECTION

PATENT NO. : 9,607,851 B2
APPLICATION NO. : 14/411978
DATED : March 28, 2017
INVENTOR(S) : Qiang Rui et al.

It is certified that error appears in the above-identified patent and that said Letters Patent is hereby corrected as shown below:

On the Title Page

Assignee: CMSC TECHNOLOGIES FAB1 CO., LTD.
Should be: --CSMC TECHNOLOGIES FAB1 CO., LTD.--

Signed and Sealed this
Eighth Day of August, 2017

Joseph Matal

Joseph Matal
*Performing the Functions and Duties of the*
*Under Secretary of Commerce for Intellectual Property and*
*Director of the United States Patent and Trademark Office*